United States Patent [19]

Sigmund

[11] 4,113,548
[45] Sep. 12, 1978

[54] PROCESS FOR THE PRODUCTION OF SILICON LAYERS

[76] Inventor: Hermann Sigmund, No. 88, Waldhornstrasse, 8034 Germering, Fed. Rep. of Germany

[21] Appl. No.: 795,844

[22] Filed: May 11, 1977

[30] Foreign Application Priority Data

May 13, 1976 [DE] Fed. Rep. of Germany ....... 2621145

[51] Int. Cl.² .................. H01L 21/368; H01L 21/208
[52] U.S. Cl. .................................. 156/622; 156/624; 427/86; 427/345; 427/404; 427/430 B; 427/431; 148/171
[58] Field of Search ................ 156/622, 624; 148/171; 427/86, 345, 404, 430 B, 431

[56] References Cited

U.S. PATENT DOCUMENTS

| 3,650,822 | 3/1972 | Grabmaier | 156/622 |
| 3,785,884 | 1/1974 | Lockwood | 156/622 |
| 3,897,281 | 7/1975 | Gilbert | 156/622 |

OTHER PUBLICATIONS

Druminski et al., Chem. Abst. vol. 85 (1975) p. 71089(b) Formation of . . . Sapphire Substrate.

Primary Examiner—Michael F. Esposito
Attorney, Agent, or Firm—John C. Smith, Jr.

[57] ABSTRACT

A process for the production of a semi-conducting silicon layer on a foreign substrate by means of melt epitaxy comprises the steps of dissolving silicon in an aluminum-zinc melt and drawing a strip-like oxidized aluminum film or a strip-like oxidized aluminum film provided with a mono-atomic silicon or metal coating across the surface of the melt solution.

9 Claims, 3 Drawing Figures

PROCESS FOR THE PRODUCTION OF SILICON LAYERS

BACKGROUND OF THE INVENTION

This invention relates to a process for the production of semi-conducting silicon layers on oxidized aluminum films by means of an isothermal silicon separation from silicon-aluminum-zinc melts.

Various processes are known for the production of thin crystalline silicon layers on foreign substrates. A number of process systems may be characterized in that by evaporation of solid silicon under vacuum by means of resistance heating or by electron bombardment silicon atoms are condensed on a substrate; this also includes the condensation of charged silicon atoms. In particular those process systems are of technical importance which may be characterized by a reactive condensation of silicon atoms on foreign substrates, such as for instance the reduction of halide or hydrohalide compounds with siicon, e.g. $SiCl_4$ or $SiHCl_3$. As compared with a simple condensation, the reactive condensation is distinguished by higher separation rates. Sometimes the required high substrate temperature is of a disadvantage for the reactive condensation, which temperature can very greatly limit the choice of suitable substrates. Both for the simple and the reactive condensation the high energy requirements are of a disadvantage, related to the separated quantity of silicon. As compared therewith, process systems based on the separation of silicon from solution melts have the advantages of a high separation rate at a low process temperature and a comparatively lower energy requirement per separated silicon quantity. Next to the above-mentioned factors which in particular determine the economies of a production process, for the technical application of thin silicon layers the achievable physical parameters have an importance of the same rank, however, such as for instance the doping, the life achievable of the minority charge carriers and the properties of the crystallinity. With the process systems mentioned on amorphous foreign substrates only polycrystalline silicon layers are able to be produced; the charge carrier transport actions in silicon layers having a high crystalite density are sometimes so badly affected that a technical use for semi-conductor elements must be precluded. For specific technical uses it is therefore of material importance that silicon layers are able to be produced which possess a coherent crystal structure across extended areas, the lateral dimensions of the crystallits preferably having to be significantly larger than the thickness of the silicon layer.

SUMMARY OF THE INVENTION

It is an object of this invention to provide a process for the separation of silicon from solution melts which permits comparatively high process speeds to be accomplished in spite of low process temperatures and the use of pure materials and thus also the cumulated energy requirements for the production of silicon layers on foreign substrates to be kept low.

Another object of the invention is to provide a process by means of which coarse crystalline silicon layers are able to be produced having dopings variable within specific limits. The silicon layer thicknesses in this regard are to amount to $10^{-3}$ cms to $4 \cdot 10^{-3}$ cms.

This invention includes the use of an aluminum-zinc melt which preferably contains 90 mol percent aluminum and 10 mol percent zinc up to 20 mol percent aluminum and 80 mol percent zinc. According to this invention, furthermore an aluminum film having an oxidized surface is used as a substrate, the thickness of the substrate film having approximately the thickness of the silicon layer to be applied thereto and the structure of the aluminum oxide being amorphous.

The temperature of the aluminum-zinc melt is below the melting point of the oxidized aluminum film, but it is high enough so that sufficient silicon may be dissolved in the aluminum-zinc melt. The melt saturated with silicon is contained in a container at the same high temperature. In a part of the container, solid silicon pieces are in contact with the melt. In a second part of the container, the oxidized aluminum strip is drawn across the surface of the melt, the aluminum-zinc melt saturated with silicon wetting the amorphous aluminum oxide surface. The aluminum-zinc melt saturated with silicon is recirculated in drawing direction or opposite to the drawing direction of the aluminum film.

In order to achieve a separation of silicon on the oxidized aluminum film, the film is cooled in the contact region of the melt in that heat is passed off the face of the oxidized aluminum strip remote from the melt by radiation and convection.

For achieving a planar-like crystal growth on the amorphous aluminum oxide layer, the aluminum oxide layer may contain a coat of silicon atoms or of atoms of a metal having a high surface energy rating. The coating density of the silicon or metal atoms in this regard does not exceed the surface density of the aluminum and oxygen atoms of the amorphous aluminum oxide layer.

BRIEF DESCRIPTION OF THE DRAWING

A preferred embodiment of the invention will know be described by way of example and with reference to the accompanying drawing, in which.

DESCRIPTION OF THE PREFERRED EMBODIMENT

Figure 1:
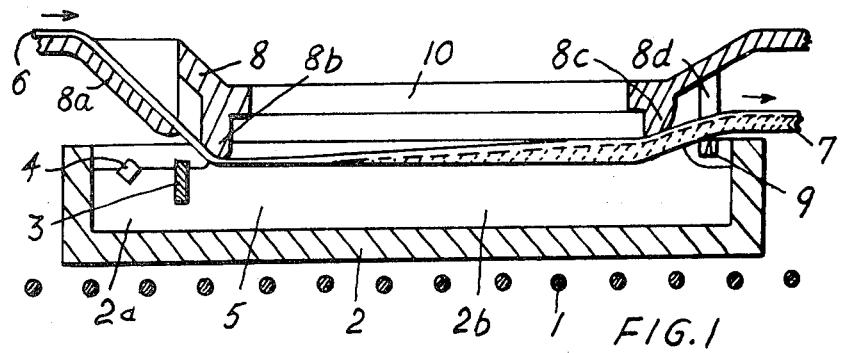
FIG. 1 is a cross-sectional view of a silicon epitaxy apparatus.

FIG. 1 shows a melt container 2 which is divided by a web 3 into two compartments 2a and 2b. For purposes of explanation, the heat source has been illustrated by the cross sections of heating wires 1, and it represents a resistance heater. This heat source is of such a nature that the melt container 2 and the melt may assume a uniform temperature. The melt container 2 is filled with an aluminum-zinc melt through the container compartment 2a. The aluminum-zinc melt used has a composition of 90 mol percent aluminum and 10 mol percent zinc up to 20 mol percent aluminum and 80 mol percent zinc. At the same time the container compartment 2a is supplied with silicon in a suitable granular or lumpy form. The silicon dissolves in the aluminum-zinc melt, until an aluminum-zinc-silicon mixture 5 saturated with silicon is present, excessive solid silicon 4 floating on the melt surface. The means required for supplying the aluminum-zinc melt and the granular silicon have not been illustrated for the sake of simplicity.

An oxidized aluminum film or strip 6 is advanced to the melt, i.e. to the aluminum-zinc-silicon mixture 5 through a strip retainer 8 by means of slide guides 8a and 8b and wets the aluminum-zinc melt saturated with silicon underneath the slide guide 8b which is comb-shaped. The aluminum strip 6 provided with the grown silicon layer 7 is lifted off the melt through slide guides 8c and 8d, underneath the guide comb 8c the wetting of the silicon layer 7 with the melt tearing. Major melt residue adhering is stripped off by the web-shaped configuration 9 of the slide guide 8d.

The strip retainer 8 is provided with a rectangular opening 10 above the oxidized aluminum strip 6 which is in contact with the melt, said opening permitting an overcooling of the aluminum-zinc melt saturated with silicon by heat radiation from the strip top side and by heat convection. As a result of the thereby reduced solubility of silicon in the melt, a separation of silicon on the oxidized aluminum strip 6 occurs.

The epitaxy apparatus illustrated in FIG. 1 is suited for continuous operation. The strip retainer 8 and the melt container 2 are not rigidly connected to one another. The strip retainer is able to be lifted or lowered and shifted in direction of movement of the strip (not illustrated).

Figure 2:
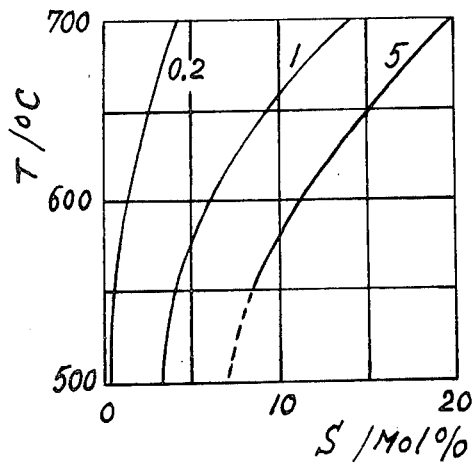
FIG. 2 is an illustration of the solubility of silicon in aluminum-zinc melts in relationship to the temperature and the mol ratio of alumium to zinc as parameters.

Preferably, the temperature of the melt T is 600° C. (FIG. 2). At this temperature, in 1 liter melt having the composition of 83% aluminum and 17% zinc 290 g silicon are dissolved. The partial vapor pressure of the zinc vapor above the melt is then 1.8 torr and thus by a factor of 6.7 lower than the vapor pressure of a pure zinc melt at the same temperature. For a mol ratio of 50% Al/50% Zn or 17% Al/83% Zn at 600° C. in 1 liter of melt 200 g or 43 g of silicon dissolve. The partial vapor pressure of the zinc vapor above the melt saturated with silicon is 5.6 to 10 torr and is lower by the factor of 2.2 or 1.2 than the vapor pressure above a pure zinc melt at 600° C.

The melt saturated with silicon is for instance recirculated by pumping means in the direction of or opposite to the direction of drawing of the aluminum strip (not illustrated). Thus, a convective transport of silicon in the melt is insured. For a laminar flow of the melt recirculated, the separation rate of silicon on the substrate is:

$$r = K \cdot \Delta x_{Si} \cdot w_r^{1/2};$$

wherein $w_r = w_1 \pm w_s$.

Therein:
- $w_r$ is the flow velocity of the melt in relationship to the substrate
- $w_1$ is the flow velocity of the recirculated melt
- $w_s$ is the drawing speed of the aluminum strip
- $\Delta x_{Si}$ is the oversaturation of the melt with silicon in the area of the strip substrate.

The constant K therein is determined by the diffusion constante of the silicon atoms in the melt D, the kinematic viscosity of the melt $\nu$ and the length of the separation zone 1; therein, for $D = 10^{-4}$ cm$^2$·sec$^{-1}$, $\nu = 10^{-3}$ cm$^2$·sec$^{-1}$ and $l = 100$ cm, $K = 4.5 \cdot 10^{-4}$ cm$^{1/2}$. For a flow velocity $w_1 = 1$ cm·sec$^{-1}$ and an oversaturation of the melt of $\Delta x_{Si} = 0.01$ the separation rate of silicon thus is $r = 4.5 - 10^{-6}$ cm sec$^{-1}$. The oversaturation of $\Delta x_{Si} = 0.01$ therein corresponds to an overcooling of 30° C. for a mol ratio of 50% aluminum/50% zinc (cf.FIG. 2).

Figure 3:
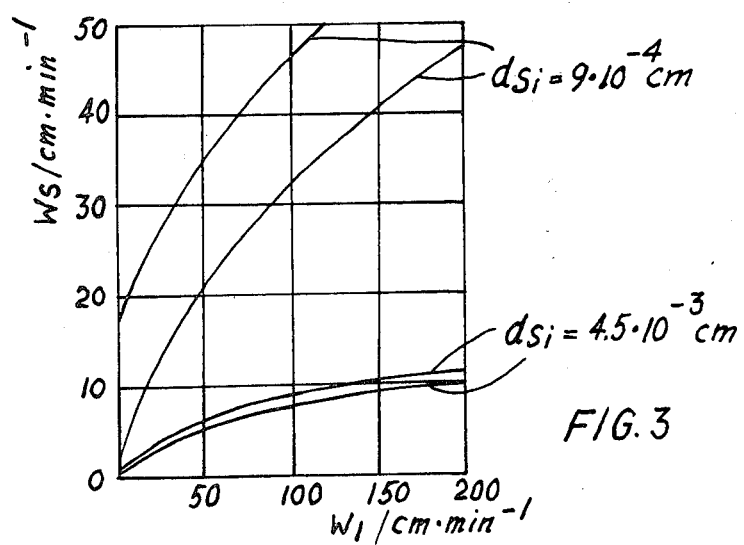
FIG. 3 is an illustration of the strip drawing velocities in relationship to the circulation speed of the saturated silicon-aluminum-zinc melt, the silicon-layer thickness being a parameter.

The achievable strip drawing speed $w_s$ depending on the flow velocity of the melt $w_1$ with the silicon layer thickness $d$ as a parameter is illustrated in FIG. 3. For a flow velocity of the melt $w_1 = 60$ cm min$^{-1}$ and a silicon layer thickness of $d = 9 \cdot 10^{-4}$, the drawing speed $w_s = 24$ cm min$^{-1}$ (or $w_s = 37$ cm min$^{-1}$ in the case of countercurrent); for the same flow velocity of the melt and a silicon layer thickness of $d = 45 \cdot 10^{-4}$, the drawing speed is $w_s = 5.8$ cm min$^{-1}$ (or $w_s = 6.2$ cm min$^{-1}$ in case of countercurrent).

The properties of the crystal structure of the silicon layer separated from the melt to a great extend depends on the nature of seed formation on the amorphous aluminum oxide layer. Therefore, for achieving a coarse-crystalline silicon structure, a planar-like growth of the silicon crystal seeds in the first phase of silicon separation is to be strived for. This is provided, as is well-known, when the interface tension substrate-melt is large and the two interface tensions substrate-silicon and melt-silicon are small. In order to influence the interface tensions in such a way that a planar-like crystal growth is accomplished, according to the invention the oxide layer of the aluminum strip may be coated or doped with a metal prior to silicon coating. This metal coating or doping only covers the surface region of the amorphous aluminum oxide layer of the aluminum strip.

The electrical conductivity of the silicon layers is prevailingly determined by the doping with aluminum atoms (acceptors). The concentration of the zinc atoms in the silicon layers is lower by the factor of $10^3$ to $10^4$ than the concentration of aluminum atoms. With the mol ratio aluminum/zinc selected, of the melt, the aluminum doping of the silicon layers may be adjusted in the range of $6 \cdot 10^{17}$ to $5 \cdot 10^{18}$ Al atoms per cm$^3$; the electrical conductivity then is $8 \cdot 10^{-2}$ to $2 \cdot 10^{-2}$ $\Omega$cm. It is known that for the mentioned doping concentrations the life of the electrons is predominantly determined by Auger recombination processes. Without a consideration of further recombination processes such as for instance at grain borders or at contaminations, the life of the electrons depending on the doping concentration would be between $10^{-5}$ to $10^{-7}$ sec; these lifes would correspond to diffusion lengths of $10^{-3}$ to $10^{-2}$ cm.

The invention has been explained in close detail in referring to a preferred embodiment. It is clear for one skilled in the art, however, that it is in no way limited thereto, but that this may be modified and altered in various aspects without thereby leaving the scope of the instant invention.

What is claimed is:

1. A process for the production of a semi-conducting silicon layer on a foreign substrate by means of melt epitaxy, wherein silicon is dissolved in an aluminum-zinc melt and a strip-like oxidized aluminum film is drawn across the surface of the melt solution.

2. A process according to claim 1, wherein the aluminum-zinc melt has a composition within the range of 90 mol percent aluminum and 10 mol percent zinc up to 20 mol percent aluminum and 80 mol percent zinc.

3. A process according to claim 1, wherein the melt is recirculated in the drawing direction of the aluminum strip.

4. A process according to claim 1, wherein the melt is recirculated in a direction opposite to the drawing direction of the aluminum strip.

5. A process according to claim 1, wherein the structure of the aluminum oxide layer is amorphous.

6. A process according to claim 1, wherein the surface of the aluminum oxide layer includes a mono-layer of silicon atoms to obtain planar-like crystal growth of said silicon layer on said aluminum oxide layer.

7. A process according to claim 6, wherein said aluminum oxide layer is amorphous and the density of said silicon atoms does not exceed the surface density of the aluminum and oxygen atoms of said amorphous aluminum oxide layer.

8. A process according to claim 1, wherein the surface of the aluminum oxide layer includes a mono-layer of metal atoms to obtain planar-like crystal growth of said silicon layer on said aluminum oxide layer.

9. A process according to claim 8, wherein said aluminum oxide layer is amorphous and the density of said metal atoms does not exceed the surface density of the aluminum and oxygen atoms of said amorphous aluminum oxide layer.

* * * * *